US 7,364,474 B2

(12) United States Patent
DeLessert et al.

(10) Patent No.: US 7,364,474 B2
(45) Date of Patent: Apr. 29, 2008

(54) CABLE TERMINAL WITH CONTACT PINS INCLUDING ELECTRICAL COMPONENT

(75) Inventors: Dan DeLessert, Newburg, OR (US); Jon Hoffman, Vancouver, WA (US)

(73) Assignee: Precision Interconnect, Inc., Wilsonville, OR (US)

( * ) Notice: Subject to any disclaimer, the term of this patent is extended or adjusted under 35 U.S.C. 154(b) by 0 days.

(21) Appl. No.: 10/686,147

(22) Filed: Oct. 14, 2003

(65) Prior Publication Data

US 2005/0079771 A1  Apr. 14, 2005

(51) Int. Cl.
*H01R 13/24* (2006.01)
(52) U.S. Cl. ...................................... 439/700
(58) Field of Classification Search ................ 439/169, 439/219, 482, 345, 66, 700, 701; 324/72.5, 324/538, 761, 754, 752
See application file for complete search history.

(56) References Cited

U.S. PATENT DOCUMENTS

| | | | | |
|---|---|---|---|---|
| 2,849,681 A | * | 8/1958 | Belart | ......................... 324/149 |
| 3,548,829 A | | 12/1970 | Reynolds et al. | |
| 4,041,380 A | | 8/1977 | Epstein | |
| 4,209,742 A | * | 6/1980 | Bender et al. | .............. 324/72.5 |
| 4,418,314 A | * | 11/1983 | Nieto, Jr. | .................... 324/72.5 |
| 4,568,873 A | | 2/1986 | Oyanagi et al. | |
| 4,739,259 A | * | 4/1988 | Hadwin et al. | .............. 439/620 |
| 4,904,935 A | * | 2/1990 | Calma et al. | ................ 324/754 |
| 5,046,968 A | | 9/1991 | Baur et al. | |
| 5,084,673 A | | 1/1992 | Kazama | |
| 5,103,165 A | * | 4/1992 | Sirattz | ......................... 324/133 |
| 5,196,789 A | * | 3/1993 | Golden et al. | .............. 439/482 |
| 5,248,266 A | | 9/1993 | Clyatt et al. | |
| 5,942,701 A | * | 8/1999 | Kamiya | ....................... 439/482 |
| 6,407,562 B1 | * | 6/2002 | Whiteman | ................... 324/754 |
| 6,552,523 B2 | * | 4/2003 | Huard | ........................ 324/72.5 |
| 6,575,772 B1 | | 6/2003 | Soubh et al. | .............. 439/76.1 |
| 6,688,906 B2 | * | 2/2004 | Kimbley | ..................... 439/482 |
| 7,118,382 B2 | | 10/2006 | Kerekes et al. | |

FOREIGN PATENT DOCUMENTS

| | | |
|---|---|---|
| DE | 3500226 A1 | 7/1986 |
| DE | 7914951 U1 | 7/1989 |
| DE | 3815573 A1 | 11/1989 |
| EP | 0257832 A | 3/1988 |
| GB | 2125236 A | 2/1984 |

OTHER PUBLICATIONS

International Search Report for International Application No. PCT/US2004/033373.
International Search Report for International Application No. PCT/US2005/007042.

* cited by examiner

Primary Examiner—Briggitte R. Hammond

(57) ABSTRACT

A cable terminal or connector has several electrical probes. Each probe has a conductive sleeve defining a bore, with a probe pin received in the bore. The probe pin has a free end contact tip extending in a first direction beyond the periphery of a circuit board supporting the sleeves, with the probe pin being biased in the first direction. The probe pin includes an electrical component near the tip. The component may be a resistor and capacitor arranged in parallel, and providing the sole electrical communication between the first and second portions. The component may be mounted between flanges on each of the first and second components, and enclosed in a sleeve connected to the flanges. The second portion with the tip is relatively short compared to other components and dimensions of the probe and connector.

33 Claims, 3 Drawing Sheets

US 7,364,474 B2

CABLE TERMINAL WITH CONTACT PINS INCLUDING ELECTRICAL COMPONENT

FIELD OF THE INVENTION

This invention relates to electrical probes, and more particularly to probes for high speed cables terminals with multiple conductors.

BACKGROUND OF THE INVENTION

Certain high speed electronic cable terminals employ arrays of spring pins to contact pads or lands of a circuit board or integrated circuit under test, or to contact connections of an electronic device for a permanent connection. The spring pins are straight, elongated pins received in cylindrical sleeves, and which are axially biased by spring pressure to an extended position. All pins extend in the same direction, with all the pin tips in a common plane. Contact is made by aligning the terminal with the device being probed or contacted, and applying axial pressure to ensure contact by each pin with a minimum pressure. The range of motion of each pin accommodates contour variations in the device being contacted, and slight variations in the position of each pin.

For applications in which very high frequency signals are to be transmitted, the cable to which the terminal is connected may be formed of coaxial wires, each shielded to provide consistent performance and to prevent cross talk and other electronic interference. A terminal housing having a metal shield layer encloses the sleeves retaining the pins. One such particularly effective device is shown in U.S. Pat. No. 6,575,772 to Soubh, the disclosure of which is incorporated herein by reference. This prior art connector has proven effective at providing a high impedance/high frequency probe assembly with relatively small probe spacing. It is believed to be useful for frequencies as high as 5 GHz. However, while effective, this limitation prevents usage for higher frequency applications.

SUMMARY OF THE INVENTION

The present invention overcomes the limitations of the prior art by providing a cable terminal or connector having several electrical probes. Each probe has a conductive sleeve defining a bore, with a probe pin received in the bore. The probe pin has a free end contact tip extending in a first direction beyond the periphery of a circuit board supporting the sleeves, with the probe pin being biased in the first direction. The probe pin includes an electrical component near the tip. The component may be a resistor and capacitor arranged in parallel, and providing the sole electrical communication between the first and second portions. The component may be mounted between flanges on each of the first and second components, and enclosed in a sleeve connected to the flanges. The second portion with the tip is relatively short compared to other components and dimensions of the probe and connector.

DETAILED DESCRIPTION OF A PREFERRED EMBODIMENT

Figure 1:
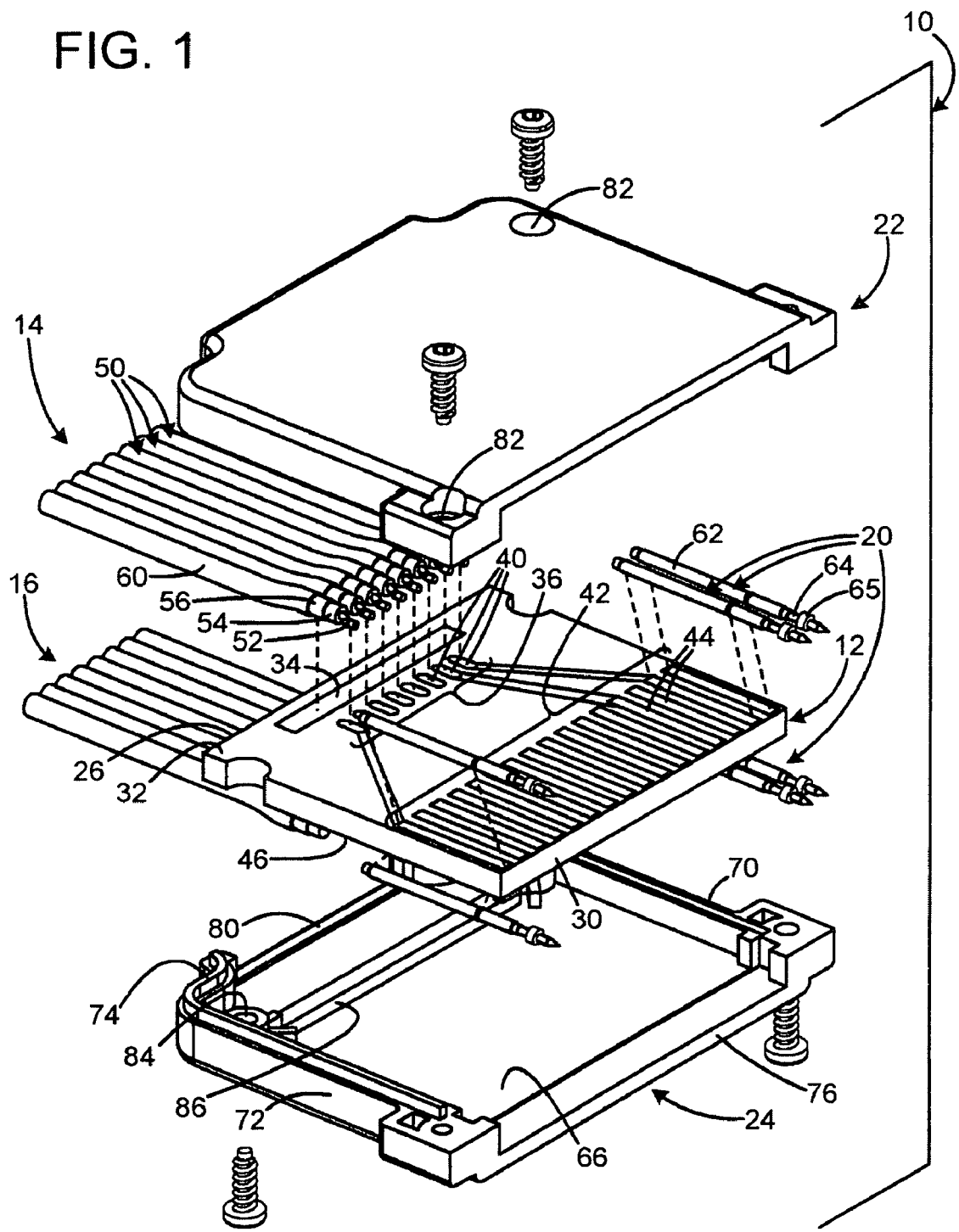
FIG. 1 is an exploded perspective view of a cable terminal assembly according to a preferred embodiment of the invention.

FIG. 1 shows an exploded view of a cable terminal 10. The terminal includes a printed circuit board 12 to which are connected a first ribbon cable 14, and a second ribbon cable 16. A plurality of spring pins 20 are also connected to the board. A housing having an upper shell half 22 and a lower shell half 24 enclose the board.

The printed circuit board is a generally rectangular shape having a cable attachment edge 26 and an opposed pin attachment edge 30. The board includes a pattern of exposed pads and covered traces, all formed of conductive material such as copper foil. Referring to an upper major face 32 of the board, the pattern includes an elongated ground bar 34 parallel to and adjacent to the cable attachment edge 26. Adjacent to and parallel to the ground bar is an array 36 of separate signal pads 40, each pad being perpendicular to edge 26.

An array 42 of elongated pin attachment pads 44 is positioned along the entire length of the pin attachment edge 30 of the board. Each pad is an exposed elongated element having an axis perpendicular to the board edge 30. The array 42 has an odd number of pads, with the end most pads being considered as odd numbered. All odd numbered pads are connected by way of traces on the board surface, and/or buried ground planes to be discussed below, to the ground bar 34. The interspersed even pads are each independently connected to a corresponding signal pad 40.

The board has a lower major face 46 that is patterned the same as the upper face 32, so that all features and functions of the upper surface have a corresponding feature or function on the lower surface. The board includes multiple buried ground planes at different depths, as will be discussed below with respect to FIG. 2. In the preferred embodiment, the board is 1.395 inch wide by 0.935 inch long (from edge 26 to edge 30). It has a thickness of 0.086 inch, and is formed of GETEK laminates. The ground bar 34 is 0.10 inch wide and 0.71 inch long. There are 16 signal pads 40 on each face in the preferred embodiment, although this may be varied depending on the application. The signal pads are spaced apart at 0.066 inch center to center, and each pad is 0.035 inch wide and 0.090 inch long. The pin pads 44 are spaced apart at 0.075 inch center to center, and each pad is 0.025 inch wide and 0.50 inch long.

The cables 14 and 16 are identical, each with 16 wires 50 (the number of which may vary as noted above with respect to the signal pads.) Each cable is formed as a ribbon with the wires connected to each other side-by-side, at least at the ends. The wires are coaxial, with a central signal-carrying conductor 52 surrounded by a dielectric 54, which is wrapped by a conductive shield 56. A jacket 60 surrounds the shield. In the preferred embodiment, the central conductor is 26 gauge, the dielectric has a diameter of 0.053 inch, and the shield is a copper foil. The jacket is formed of PVC. The wires are arranged with a spacing of 0.066 inch, the same as that of the signal pads 40 on the board.

The spring pins 20 each include a metal sleeve 62 that receives a pin assembly 64 having an enlarged portion 65 containing electrical components as will be discussed below. An end portion of the pin protrudes from one end of the sleeve, and the pin slides axially within the sleeve. A spring in the sleeve at the other end biases the pin to an extended position (shown), and allows the pin to move into the sleeve under axial pressure, such as when the pin assembly is pressed toward a hard surface.

The housing elements 22, 24 are essentially identical. Each is a tray-shaped shell having a planar major wall 66, with peripheral side walls 70, 72, and a single end wall 74 extending perpendicularly from the major wall. The major wall 66 may incorporate features which vary in distance from the electrical elements of the board assembly 12. These features exist to maintain the consistency of the electrical ground return path (impedance). A front edge 76 of the major wall 66 has no wall attached. The end wall defines a cutout 80 that is a central section of the wall having a lower rim. The edges of the end wall at the cutout are semicircularly radiused to receive a cable without sharp corners that may generate strain and impair cable performance. The inner surfaces of the housing elements are coated with a conductive material such as Chomerics CHO-Shield coatings to provide a shield against electrical and magnetic interference. The inner surfaces include all surfaces that face the printed circuit board 12. Thus, when assembled, there is a metallic enclosure that it open only at the slot to receive the cable, and at the side where the pins protrude. The housing is formed of plastic, and has a typical wall thickness of 0.040 inch. A pair of screw fasteners is used to secure the halves together, passing through bores 82 in the upper half 22, and engaging smaller bores 84 in the lower half.

Figure 2:
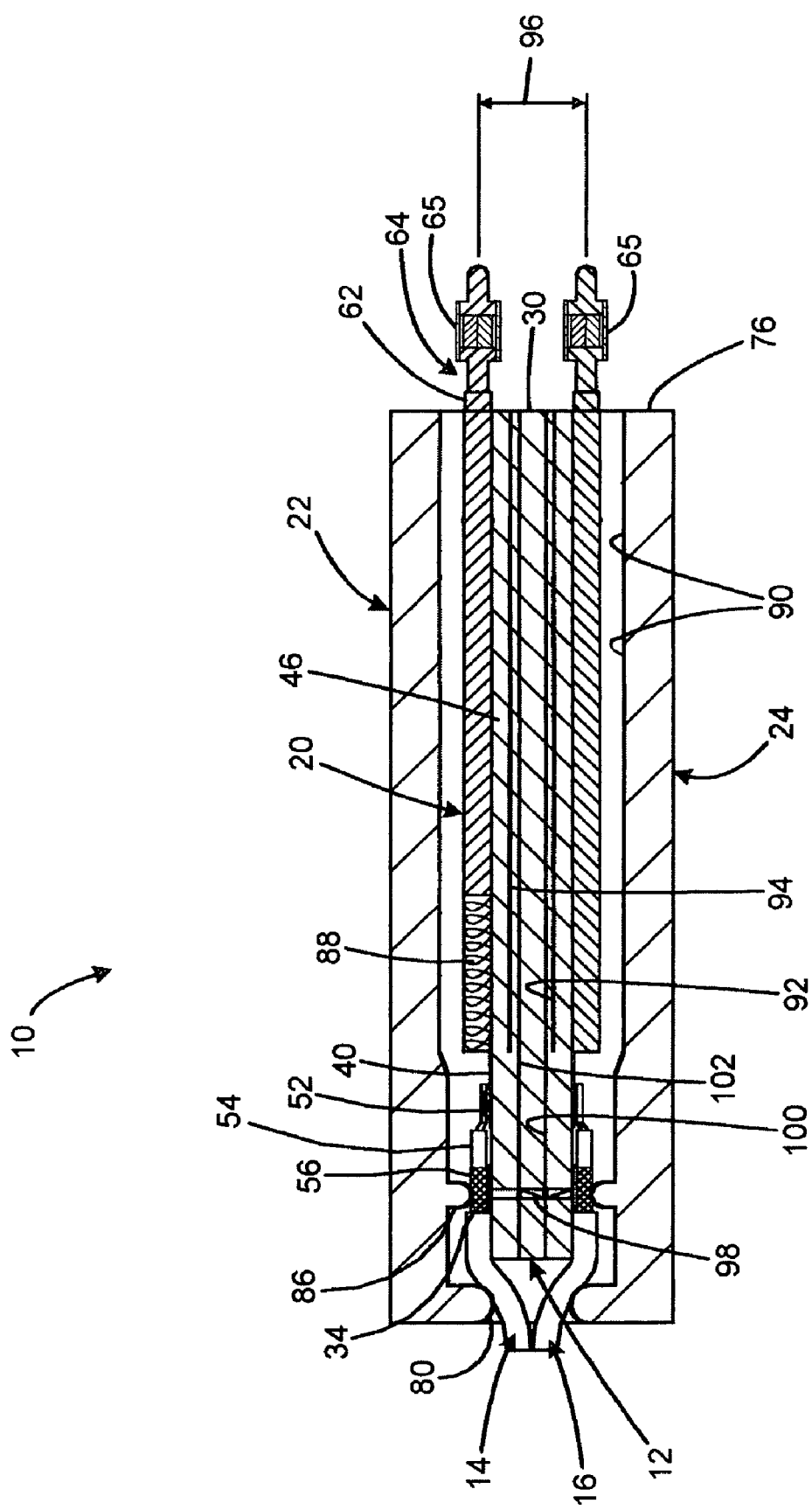
FIG. 2 is a sectional side view of the assembly of FIG. 1.

FIG. 2 shows the assembled terminal 10. The sleeves 62 of the spring pins 20 are soldered to the spring pin pads 46, so that the free ends of the pins protrude beyond the edge 30 of the board 12, and beyond the edge 76 of the housing elements 22, 24. Each spring pin element contains a compressed coil spring 88 as illustrated. The cables 14, 16 are connected to the board, with each exposed central conductor 52 soldered to a respective pad 40, and all the shields of each ribbon soldered to the ground bar 56. The ribs 86 press against the shields, so that the conductive layer 90 makes ohmic contact to ground the housing.

The board 12 has several interior buried ground planes. At a minimum, the board has two ground planes 92, 94, each equally spaced apart from the nearest major surface. The requirement for two ground planes exists because the spacing 96 between the rows of pins is pre-defined by design rules and the needs of the application. However, the spacing of the ground plane from the surface conductors is based on electrical design factors that are used to generate performance characteristics comparable to the coaxial wires. The housing conductive layer 90 and ground plane serve the same function as the shield of the coaxial wire; the alternating grounded pins provide lateral shielding with respect to adjacent pins. A ground via 98 connects to all of the ground planes, and to the ground bars 34. The number and placement of the ground vias will vary with different designs.

In addition, different portions of the board and circuit may have different impedance characteristics, and may require different ground plane spacings to achieve uniform impedance results. Ground planes may also reside on the outer surfaces of the board, to provide improved additional shielding and improve the ground return path of the signals. In the illustrated embodiment, ground planes 92 and 94 extend under the region of the pins. Deeper ground planes 100, 102 serve to provide shielding and impedance control away from the pins, where foil traces extend across the circuit board. Although not shown, there are connections between the ground planes 100, 102 and the via 98.

The spring pins and receptacles were chosen in concert with the locations of ground planes and the design of the housing to preserve the matched impedance characteristics of the electrical signal.

Figure 3:
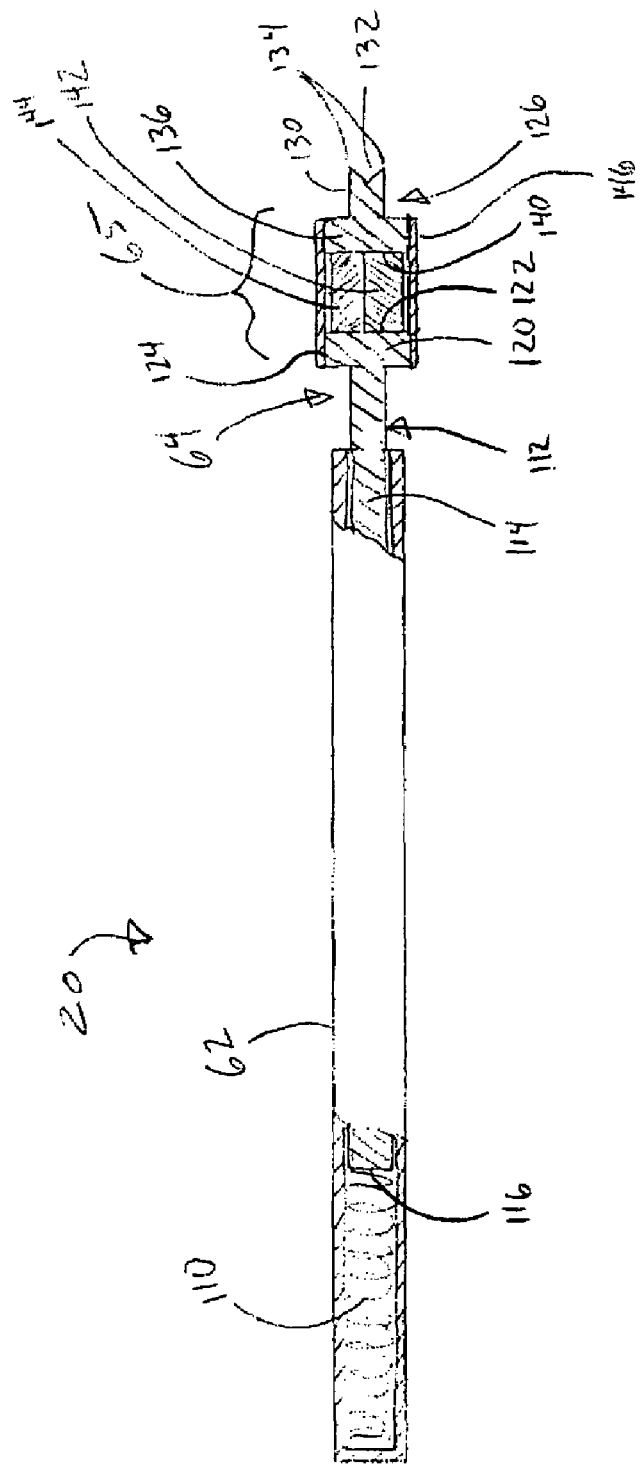
FIG. 3 is a sectional side view of a probe pin assembly according to the embodiment of FIG. 1.

FIG. 3 shows the spring pin 20 in which the pin assembly 64 is biased in the extended position by a spring 110 in the sleeve 62. The pin assembly includes two conductive metal portions. A first pin portion 112 has an elongated shaft 114, the majority of which is closely received in the sleeve. The shaft has a rear end 116 against which the spring presses. The first portion 112 terminates at the free end with an nail-head-like flange 120 having a flat circular surface 122 extending axially away from the pin, perpendicular to and centered on the pin axis. The flange has a cylindrical peripheral surface 124 having a diameter larger than the sleeve, although this may vary in alternative embodiments.

A second portion 126 of the pin is positioned forward of the first portion, and has a minimal length shaft 130 having a free end 132 having one or more sharp probe points 134. The shaft terminates at its rear end facing the first pin portion with a flange 136 shaped and sized the same as the first portion flange 120, with a rear surface 140 facing and parallel to the surface 122 of the first portion flange face. The pin portion shafts are aligned on a common axis.

The flange surfaces are mechanically and electrically connected to a resistor 142 and a capacitor 144 that are connected in parallel between the flanges. Each of these electronic components has a end pole face with metallization that facilitates soldering directly to the pin flange for a strong mechanical connection that provides structural support for the second pin portion. Sometimes the components are of unequal size and the mechanical shape of the flange must be shaped, (such as with a step) to accommodate the different dimensions. Also, the sleeve can provide mechanical strength to compensate when components are fragile, or too small or otherwise unsuited to provide substantial strength. To provide additional structural support, and to protect the components with a mechanical barrier and environmental seal, a plastic sleeve 146 encloses the flanges and components. The sleeve fits the flange peripheries closely, so that it can be sealed with a wicking adhesive such as cyanoacrylate. The sleeve has a length adequate to entirely cover the flanges without overhang.

In the preferred embodiment, the sleeve is formed of gold-plated nickel/silver, and has a length of 0.292 inch, a diameter of 0.025 inch, and an interior bore diameter of 0.020 inch. The pin's first portion 112 has a shaft length of 0.084 inch, a shaft diameter of 0.015 inch, a flange diameter of 0.020 inch, and a flange thickness or axial length of 0.010 inch. The pin's second portion 126 has a shaft length of 0.015 inch, and a shaft diameter of 0.020 inch. The pin portion shaft diameters is the same in the preferred embodiment, although this need not be the case for alternative embodiments where mechanical constraints of the probe tip and the sleeve bore may provide advantages to having different diameters. The second portion has a flange diameter of 0.020 inch, and a flange thickness or axial length of 0.010 inch.

The 0.025 inch overall length of the second pin portion 126 provides significant advantages in that this very limited length between the device being probed and the electrical components 142 and 144 yields an extremely high self resonance of 12 GHz, which allows useful operation up to this frequency limit. In alternative embodiments, the second portion length can be reduced to any practical limit, including using electrical components formed with end features. The second portion tip protrudes only sufficiently that angular misalignment or raised components on the device under test do not cause unwanted contact by the flange or sleeve.

It is believed that the second portion provides a beneficial combination of electrical performance and mechanical geometry when its length is less than double the flange diameter. Also, these benefits are achieved when the length is less than 0.050 inch, because this provides an adequately low loss tangent that absorbs transmitted energy. A typical loss tangent for a conventional trace on Kapton is 0.0030 while the preferred embodiment achieves a loss tangent of zero, because the conductive portion (metal tip) of the probe between the device under test and the RC components is surrounded by air, and not mounted on film or a PC Board. Comparative performance is described in the table below.

|  | Loss tangent | Dielectric constant | Loss per foot @ 10 GHz | −3 dB loss @ 1 foot |
|---|---|---|---|---|
| Kapton | 0.0030 | 3.40 | −6.20 dB | 2.70 GHz |
| Extruded FEP | 0.0007 | 2.03 | −3.35 dB | 7.50 GHz |
| Taped PTFE | 0.0007 | 1.35 | −3.00 dB | 10.0 GHz |
| Air | 0.0000 | 1.00 | −2.60 dB | 23.0 GHz |

Because the mass of the second pin portion is so much less than the entire pin plus sleeve of the prior art, it achieves loss tangent significantly lower than the prior art, which must rely on passive RC components on the printed circuit board adjacent to the sleeve. The ratio of the lengths of second portion to the first portion (including sleeve) is less than 1 in 10, and the ratio of the mass of the second portion to that of the first portion and sleeve is less than 1:3. These low ratios provide an indication of the relative advantage of the preferred embodiment over solid pins with RC components mounted on the circuit board.

While the above is discussed in terms of preferred and alternative embodiments, the invention is not intended to be so limited.

The invention claimed is:

1. An electrical probe comprising:
a conductive sleeve defining a bore;
a signal-carrying conductor connected to the sleeve;
a probe pin movably received in the bore to reciprocate axially within the bore;
at least a portion of the probe pin and the sleeve being electrically connected to each other for all conditions of axial reciprocation;
the probe pin having a metal free end contact tip extending in a first direction;
the probe pin being biased in the first direction; and
the probe pin including an electrical component serially intervening between the free end contact tip and an opposed end of the pin, such that the electrical component reciprocates with respect to the sleeve.

2. The probe of claim 1 wherein the electrical component includes a capacitor.

3. The probe of claim 1 wherein the electrical component includes a resistor having substantially greater resistance than the pin.

4. The probe of claim 3 wherein the electrical component includes a capacitor in parallel with the resistor.

5. The probe of claim 1 wherein the pin has a first conductive portion received within the sleeve, a second conductive portion including the tip, and wherein the electrical component is connected between the first and second portions.

6. The probe of claim 5 wherein the first and second portions are electrically isolated except for connection by the electrical component.

7. The probe of claim 5 wherein the second portion has a length less than double its diameter.

8. The probe of claim 5 wherein the second portion has a length less than 0.50 inch.

9. The probe of claim 5 wherein the first and second portions each have a flange, the flanges being spaced apart and connected to the electrical component with the electrical component attached between the flanges.

10. The probe of claim 9 including a cylindrical sleeve encompassing the flanges and the electrical component.

11. An electrical connector comprising:
a body;
a plurality of probes connected to the body;
each probe having a spring biased pin with a metal contact tip;
each pin including an electrical component proximate to the tip and serially intervening between the tip and an opposed end of the pin; and
wherein the body is a circuit board having a periphery, and wherein each of the tips extends beyond the periphery.

12. The connector of claim 11 wherein the electrical component includes a resistor and a capacitor arranged in parallel.

13. The connector of claim 11 wherein each pin is received in a sleeve mounted electrically connected to a conductor on the body, and wherein each pin axially reciprocates within the sleeve.

14. The connector of claim 13 including a cable electrically connected to the body, such that each of a plurality of conductors of the cable is independently connected to each probe.

15. The connector of claim 13 wherein each pin has a first conductive portion received within the sleeve, a second conductive portion including the tip, and wherein the electrical component is connected between the first and second portions.

16. The connector of claim 15 wherein the first and second portions are electrically isolated except for connection by the electrical component.

17. The connector of claim 15 wherein the first and second portions each have a flange, the flanges being spaced apart and connected to the electrical component.

18. The connector of claim 15 wherein the second portion has a length of less than double its diameter.

19. The connector of claim 15 wherein the probes are arranged at a first pitch distance, and wherein the distance between the tip and the component is less than the first pitch distance.

20. An electrical probe comprising:
a conductive sleeve defining a bore;
a probe pin movably received in the bore and electrically connected to the sleeve;
the probe pin having a free end contact tip extending in a first direction;
the probe pin being biased in the first direction; and
the probe pin including a capacitor;
wherein the first and second portions each have a flange, the flanges being spaced apart and connected to the electrical component; and
including a cylindrical sleeve encompassing the flanges and the component.

21. The probe of claim 20 wherein the probe pin includes a resistor having substantially greater resistance than the pin.

22. The probe of claim 21 wherein the capacitor is connected in parallel with the resistor.

23. The probe of claim 20 wherein the pin has a first conductive portion received within the sleeve, a second conductive portion including the tip, and wherein the electrical component is connected between the first and second portions.

24. The probe of claim 23 wherein the first and second portions are electrically isolated except for connection by the electrical component.

25. The probe of claim 23 wherein the second portion has a length less than double its diameter.

26. The probe of claim 23 wherein the second portion has a length less than 0.50 inch.

27. An electrical connector comprising:
a body;
a plurality of probes connected to the body;
each probe having a spring biased pin with a metal contact tip;
each pin including an electrical component proximate to the tip and serially intervening between the tip and an opposed end of the pin; and
including a cable electrically connected to the body, such that each of a plurality of conductors of the cable is independently connected to each probe.

28. The connector of claim 27 wherein the electrical component includes a resistor and a capacitor arranged in parallel.

29. The connector of claim 27 wherein each pin is received in a sleeve mounted electrically connected to a conductor on the body, and wherein each pin axially reciprocates within the sleeve.

30. The connector of claim 29 wherein each pin has a first conductive portion received within the sleeve, a second conductive portion including the tip, and wherein the electrical component is connected between the first and second portions.

31. The connector of claim 30 wherein the first and second portions are electrically isolated except for connection by the electrical component.

32. The connector of claim 30 wherein the first and second portions each have a flange, the flanges being spaced apart and connected to the electrical component.

33. The connector of claim 30 wherein the second portion has a length of less than double its diameter.

* * * * *